(12) United States Patent
Merkin et al.

(10) Patent No.: US 11,984,802 B2
(45) Date of Patent: May 14, 2024

(54) RECTIFIER WITH SIGNAL RECONSTRUCTION

(71) Applicant: Texas Instruments Incorporated, Dallas, TX (US)

(72) Inventors: Timothy Bryan Merkin, Princeton, TX (US); Orlando Lazaro, Cary, NC (US); John Russell Broze, Dallas, TX (US); Nan Xing, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 40 days.

(21) Appl. No.: 17/363,050

(22) Filed: Jun. 30, 2021

(65) Prior Publication Data

US 2023/0006541 A1    Jan. 5, 2023

(51) Int. Cl.
  *H02M 1/44* (2007.01)
  *H02M 7/217* (2006.01)
  *H03K 5/24* (2006.01)

(52) U.S. Cl.
  CPC ............. *H02M 1/44* (2013.01); *H02M 7/217* (2013.01); *H03K 5/24* (2013.01)

(58) Field of Classification Search
  CPC ........... H02M 1/44; H02M 7/217; H03K 5/24
  See application file for complete search history.

(56) References Cited

U.S. PATENT DOCUMENTS

| | | | |
|---|---|---|---|
| 4,318,071 A | 3/1982 | Shepherd | |
| 5,536,980 A | 7/1996 | Kawate | |
| 5,719,450 A * | 2/1998 | Vora | H03K 17/0824 307/116 |
| 6,593,751 B2 * | 7/2003 | Takahashi | G01R 31/346 324/509 |
| 6,603,221 B1 * | 8/2003 | Liu | H03K 17/9645 307/130 |
| 7,755,400 B2 * | 7/2010 | Jordanger | H04L 25/4902 327/531 |
| 9,467,060 B2 * | 10/2016 | Boezen | H03K 19/018521 |
| 9,473,329 B1 * | 10/2016 | Edwards | H04L 25/0292 |
| 2009/0243028 A1 * | 10/2009 | Dong | H04L 5/14 257/499 |
| 2013/0278267 A1 * | 10/2013 | Hori | G01R 33/3852 324/322 |
| 2014/0252551 A1 * | 9/2014 | Dix | H01L 23/642 257/532 |
| 2014/0253227 A1 * | 9/2014 | Yach | H01L 23/49575 327/540 |
| 2016/0223620 A1 * | 8/2016 | Heber | G01R 31/40 |
| 2018/0278229 A1 * | 9/2018 | Sankaran | H03H 7/03 |
| 2021/0119629 A1 | 4/2021 | Narayanasamy | |

* cited by examiner

*Primary Examiner* — Rina I Duda (74) *Attorney, Agent, or Firm* — Frank D. Cimino (57) ABSTRACT

An electronic device has a first circuit, a second circuit, and an isolation circuit, the isolation circuit having an input and an output, the first circuit including a signal generator having an output, the output of the signal generator coupled to the input of the isolation circuit. The second circuit includes a rectifier circuit and a signal detector circuit, the rectifier circuit having a rectifier input coupled to the output of the isolation circuit, and the signal detector circuit having an input coupled to the output of the isolation circuit.

21 Claims, 8 Drawing Sheets

RECTIFIER WITH SIGNAL RECONSTRUCTION

BACKGROUND

Isolation circuitry is used to transfer signals and/or power between circuits operating at different voltage levels. In certain applications, a signal from a first isolated circuit is sent through an isolation circuit to provide both signaling and power to a second isolated circuit. However, common mode voltages can affect the performance of the isolation barrier and lead to signal loss. This can inhibit the ability of the second isolated circuit to determine whether a signal has been generated by the first circuit.

SUMMARY

In one aspect, an electronic device includes a first circuit, a second circuit, and an isolation circuit. The isolation circuit has an input and an output. The first circuit includes a signal generator having an output coupled to the input of the isolation circuit. The second circuit includes a rectifier circuit and a signal detector circuit. The rectifier circuit has a rectifier input coupled to the output of the isolation circuit, and the signal detector circuit has an input coupled to the output of the isolation circuit.

In another aspect, an electronic device includes a first circuit, a second circuit, and an isolation circuit. The first circuit includes a signal generator having an output. The second circuit includes a rectifier circuit, a signal detector circuit, and an actuator circuit. The rectifier circuit has a rectifier input and a rectifier output, the signal detector circuit has an input and an output, and the actuator circuit has a power input and a signal input. The isolation circuit has an input and an output. The output of the signal generator is coupled to the input of the isolation circuit. The rectifier input is coupled to the output of the isolation circuit and the rectifier output is coupled to the power input of the actuator circuit. The input of the signal detector circuit is coupled to the output of the isolation circuit, and the output of the signal detector circuit is coupled to the signal input of the actuator circuit.

In a further aspect, a method includes integrating a rectifier current of a rectifier diode or a rectifier transistor in a rectifier circuit to generate an integrator voltage signal; sensing a voltage of the rectifier circuit to generate a sensor voltage signal; summing the sensor voltage signal and the integrator voltage signal to generate a summed voltage signal; comparing the summed voltage signal to a threshold voltage to generate a comparator output signal; and selectively enabling or disabling an actuator circuit based on the comparator output signal.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1:
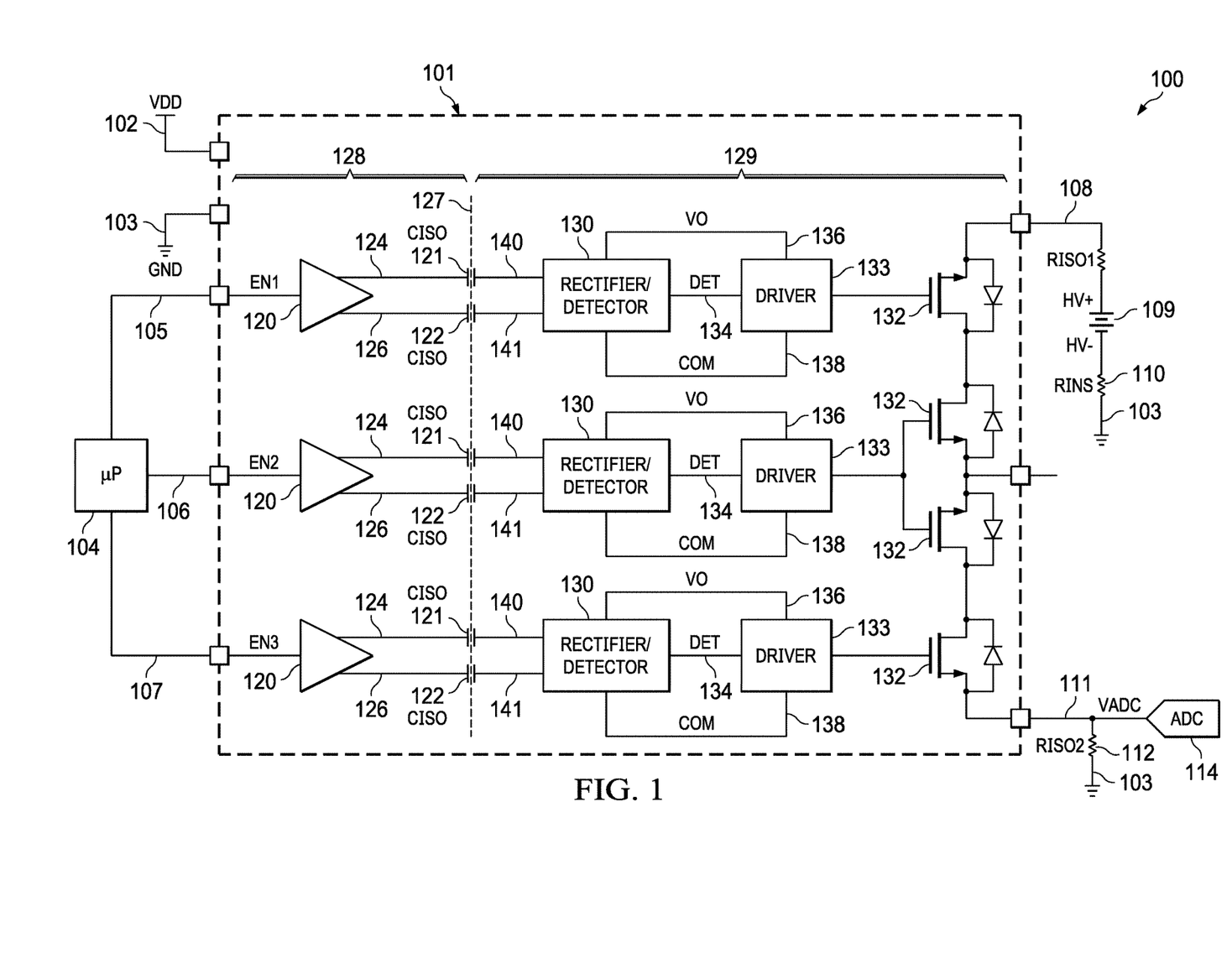
FIG. 1 is a schematic diagram of an electronic device with a rectifier and detector circuit to detect and reconstruct an enable signal delivered through an isolation barrier in the presence of common mode noise.

FIG. 1 shows a system 100 with an electronic device 101. The electronic device 101 in one example is an integrated circuit having electronic components such as transistors, resistors, capacitors formed in circuits on or in a single semiconductor die or multiple semiconductor dies that is/are packaged with externally accessible conductive leads to allow soldering to a host printed circuit board (not shown). The electronic device 101 includes a terminal adapted to be coupled to a supply source 102 that provides a supply voltage VDD to power the electronic device 101. Another terminal of the electronic device 101 is adapted to be coupled to a reference voltage node 103 having a reference voltage GND. The system 100 also includes an external processor 104 (e.g., labeled "μP" in the drawing). The processor 104 has outputs 105, 106, and 107 coupled to respective leads of the electronic device 101 to provide enable signals EN1, EN2, and EN3 for controlled operation of the electronic device 101 in the system 100.

The electronic device 101 in the illustrated example is a solid-state relay (SSR) having further leads allowing connection of external circuitry to one or more contacts of the electronic device 101. In the illustrated configuration, the first external circuit connection 108 connects a first (e.g., positive) terminal of a battery 109 through a first resistor RISO1 to a first contact of the electronic device 101. In the illustrated example, the battery 109 represents a high voltage DC battery system, for example, of an automotive vehicle. The battery 109 is a positive voltage HV+ at the first terminal, and a second (e.g., negative) terminal of the battery 109 as a voltage HV−. The second terminal of the battery 109 is connected to the reference voltage node 103 through an insulation resistance RINS of the vehicle shown as a resistor 110. Another lead of the electronic device provides a second external connection 111 that couples a first terminal of a second resistor 112 (RISO2) and an input of an analog-to-digital converter (ADC) 114 to another contact of the electronic device 101.

In the illustrated example, the solid-state relay electronic device 101 is coupled to allow automated insulation resistance testing under control of the processor 104 in order to obtain readings of a voltage VADC at the input of the ADC 114 in different conditions (e.g., open or closed) of the solid-state relay contacts based on the enable signals EN1, EN2, and EN3 generated by the processor 104. Although illustrated and described in connection with the example solid-state relay, other implements can include different forms of isolated circuits. The electronic device 101 includes a first circuit 128, a second circuit 129, and an isolation circuit that includes three pairs of capacitors 121 and 122 (e.g., having capacitances labeled "CISO"). The isolation circuit has inputs 124 and 126, as well as outputs 140 and 141 for each of three channels in the illustrated example.

The first circuit 128 includes signal generators 120 that each receives a respective one of the enable signals EN1, EN2, and EN3 from the processor 104. In the illustrated example, the signal generators 120 are differential circuits that each include a first output coupled to a first terminal of a respective one of the capacitors 121, as well as a second output coupled to a first terminal of a respective one of the capacitors 122. The first terminals of the respective capacitors 121 and 122 form the inputs 124 and 126 to respective channels of the isolation circuit, and the outputs of the respective signal generators 120 are coupled to the inputs 124, 126 of the isolation circuit. The capacitors 121 and 122 have second terminals that provide the respective outputs 140 and 141 of the isolation circuit. The capacitors 121 and 122 provide differential capacitive (e.g., AC) coupling of the differential output signals from the signal generators 120 through or across an isolation barrier 127 provided by the capacitances CISO of the capacitors 121 and 122.

The second circuit 129 of the electronic device 101 includes a rectifier and detector circuit 130 in each of the three channels shown in FIG. 1. The rectifier and detector circuit 130 in each channel is configured to detect the presence or absence of an enable signal delivered through an isolation barrier in the presence of common mode noise. Each channel of the secondary circuit includes one or more transistors 132 and a respective actuator circuit 133, such as a gate driver to provide a gate drive signal to operate the associated transistor or transistors 132. The actuator circuit 133 has a power input and a signal input.

The respective rectifier and detector circuits 130 have inputs coupled to the outputs 140 and 141 of the isolation circuit. The respective rectifier and detector circuits 130 have a signal detector output 134 and rectifier outputs 136 and 138. The respective rectifier and detector circuits 130 are configured to provide a signal detector signal DET at the signal detector output 134 based on detection of a signal received at the outputs 140, 141 of the isolation circuit. The respective rectifier and detector circuits 130 are configured to provide a rectified voltage signal VO at the rectifier output 136 and a reference or common voltage signal COM at the output 138 to power the actuator circuit 133 based on rectification of a signal received at the outputs 140, 141 of the isolation circuit. In operation in one example, the respective rectifier and detector circuits 130 can rectify common mode signals received at the outputs 140, 141 of the isolation circuit and power the respective actuator circuit 133 independent of whether the signal generator 120 generates a signal at the inputs 124, 126 of the isolation circuit.

Figure 1A:
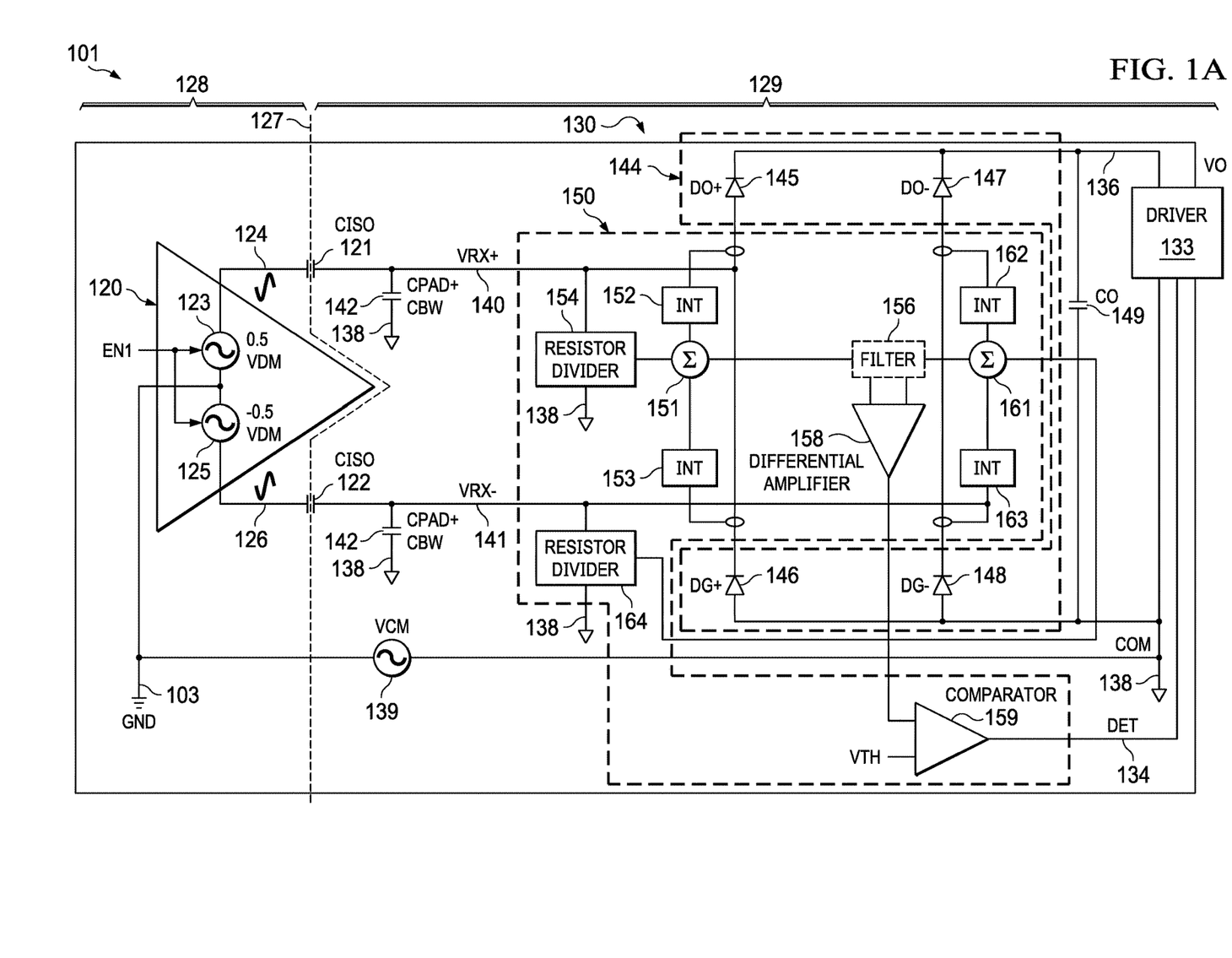
FIG. 1A is a schematic diagram of an example rectifier and detector circuit in the device of FIG. 1.

FIG. 1A shows an example rectifier and detector circuit 130 in the electronic device 101 of FIG. 1. In this example, the signal generator 120 of the first circuit 128 includes AC signal generators 123 and 125 that operate when enabled by the respective enable signal EN1 to provide a differential mode voltage signal 0.5 VDM and −0.5 VDM at the respective isolation circuit inputs 124 and 126. In one example, the AC signal generators 123 and 125 provide a generally sinusoidal differential output signal when enabled by the processor 104 (FIG. 1). In another example, the AC signal generators 123 and 125 provide an AC differential output signal having another wave shape responsive to the enable signal EN1 from the processor 104. FIG. 1A also shows capacitors 142 that represent parasitic capacitances labeled CPAD+CBW between the respective outputs 140 and 141 of the isolation circuit and the rectifier output 138.

Figure 3:
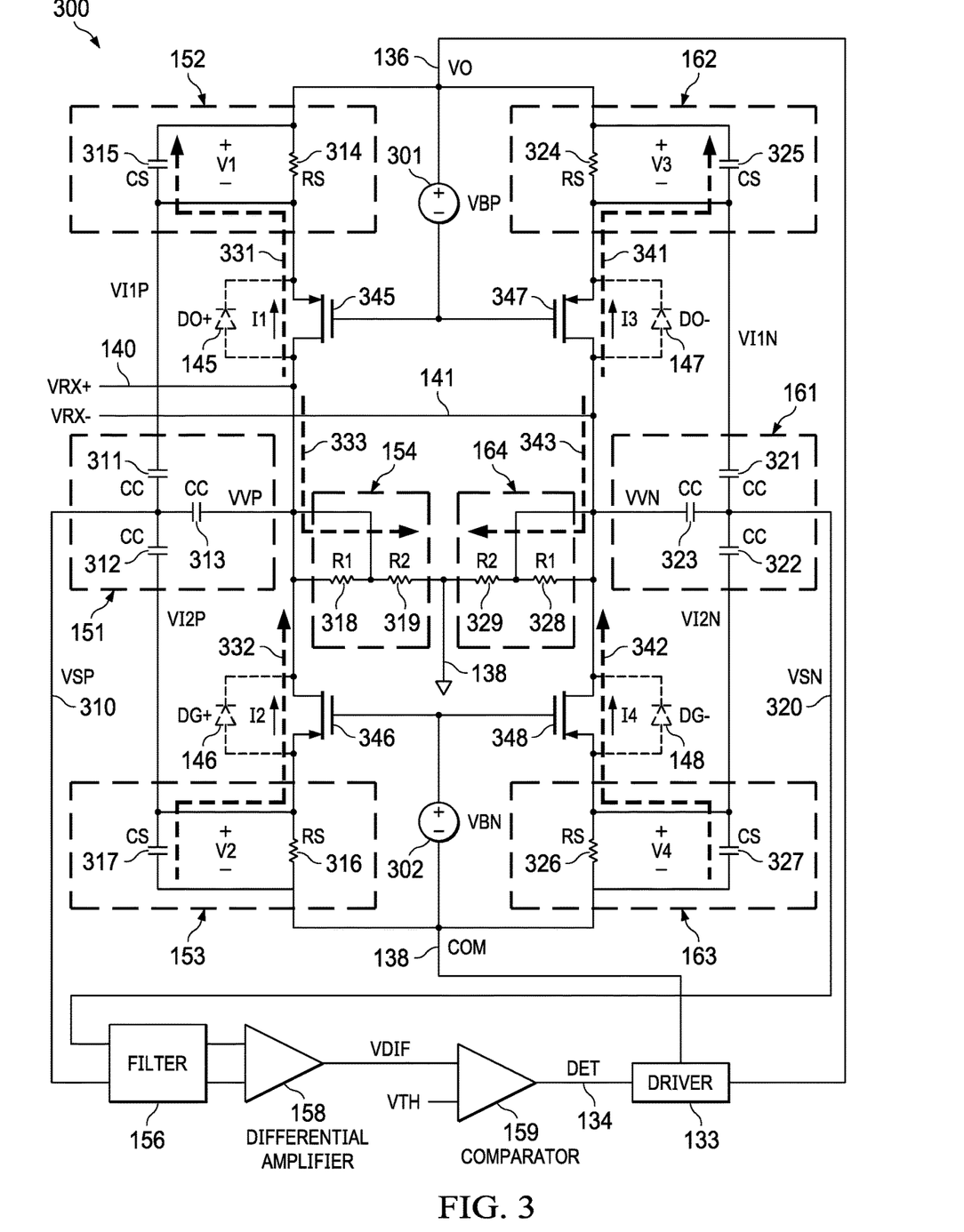
FIG. 3 is a schematic diagram of another example rectifier and detector circuit.

As shown in FIG. 1A, the rectifier and detector circuit 130 of the second circuit 129 includes a rectifier circuit 144 and a signal detector circuit 150. FIG. 1A also shows a common mode voltage source 139 that represents a common mode voltage VCM between the reference voltage node 103 of the first circuit 128 and the rectifier output 138 (COM) of the second circuit 129. The rectifier circuit 144 has a rectifier output 136, 138 coupled to the power input of the actuator circuit 133, and the rectifier circuit 144 includes rectifier diodes 145, 146, 147, and 148, respectively labeled DO+, DG+, DO−, and DG−. The diodes 145-148 are configured in a full bridge rectifier arrangement that receives AC voltages VRX+ and VRX− from the respective outputs 140 and 141 of the isolation circuit. The full bridge configuration of the diodes 145-148 in FIG. 1A also includes the rectifier outputs 136 and 138 coupled to power inputs of the respective actuator circuit 133. In another example, the rectifier circuit uses transistors (e.g., field effect transistors as shown in FIG. 3 below) to implement the illustrated rectifier diodes 145-148. In this or another implementation, the rectifier circuit 144 provides a half bridge configuration of passive rectifier diodes or transistors. In another implementation, the rectifier circuit 144 includes a single rectifier diode or a single transistor coupled to provide half-wave rectification. The second circuit 129 in FIG. 1A also includes an output capacitor 149 with a capacitance CO coupled between the rectifier outputs 136 and 138. The capacitor 149 stabilizes the rectified voltage signal VO at the rectifier output 136. The rectified voltage signal VO is used to power the actuator circuit 133.

The input of the signal detector circuit 150 is coupled to the outputs 140, 141 of the isolation circuit. The output 134 of the signal detector circuit 150 is coupled to the signal input of the actuator circuit 133. The signal detector circuit 150 in FIG. 1A is a differential circuit that includes a first branch or side having a summing circuit 151, upper and lower integrator circuits 152 and 153, and a resistor divider voltage sensing circuit 154. An output of the summing circuit 151 is coupled to a first filter input of a differential filter 156. A differential filter output of the filter 156 is coupled to a differential amplifier 158. The output of the differential amplifier 158 is coupled to an input of a comparator 159. The output of the comparator 159 provides the signal detector signal DET at the output 134.

The signal detector circuit 150 also includes a second branch or side having a summing circuit 161, upper and lower integrator circuits 162 and 163, and a resistor divider voltage sensing circuit 164. An output of the summing circuit 161 is coupled to a second input of the filter 156. In operation, comparator 159 compares the voltage signal at the output of the differential amplifier 158 to a threshold voltage VTH to generate the signal detector signal DET at the output 134 of the rectifier and detector circuit 130 responsive to detection of a signal at the output 140, 141 of the isolation circuit. In another example, the comparator 159 compares the amplitude of the output of the differential amplifier 158 to the threshold voltage VTH to generate the signal detector signal DET at the output 134. In one implementation, the circuitry includes peak-detector circuitry or mean-square circuitry to generate a voltage that represents the amplitude of the output of the differential amplifier 158 to the threshold voltage VTH, and the comparator 159 compares the generated voltage to the threshold voltage VTH. In another example, the signal detector circuit 150 is a single ended circuit having two integrator circuits, a voltage sensing circuit and a single summing circuit, and one of the circuit branches in FIG. 1A is omitted.

Figure 2:
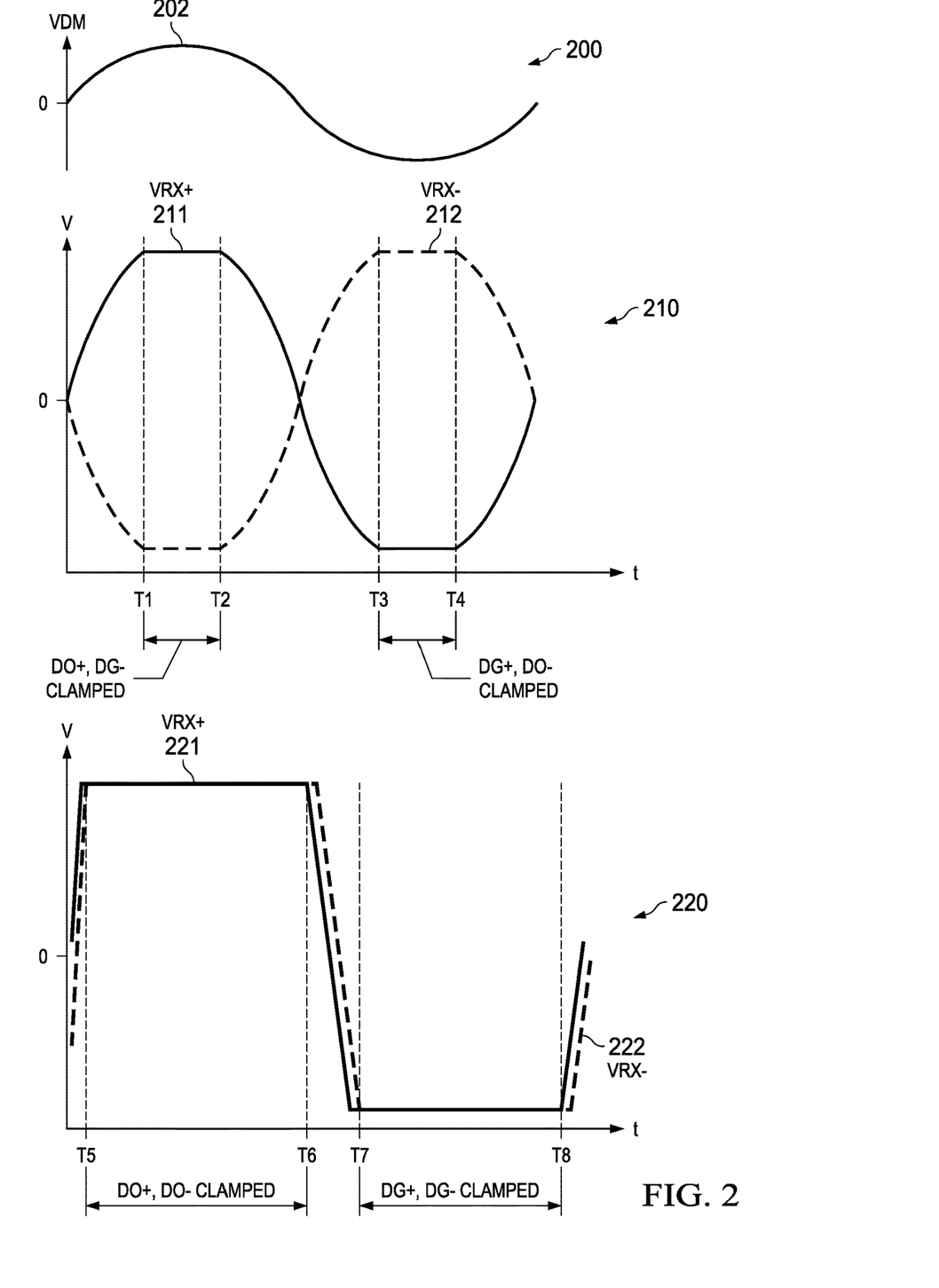
FIG. 2 is a signal diagram of signals in the rectifier and detector circuit of FIG. 1A.

Referring also to FIG. 2, graphs 200, 210 and 220 show signals in the rectifier and detector circuit 130 of FIG. 1A in operation in the presence of a received signal from the signal generator 120 and common mode noise modeled as the common mode voltage source 139 in FIG. 1A. In operation, the electronic device 101 of FIGS. 1 and 1A transfers both power and signals across the isolation barrier 127, and the device 101 mitigates signal loss due to common mode noise or interference. A curve 202 in the graph 200 shows a single cycle of an example sinusoidal voltage signal VDM transmitted by the signal generator 120 through the capacitors 121 and 122 of the isolation circuit. The graph 210 includes a first curve 211 that shows a received voltage signal VRX+ at the output 140 of the isolation circuit, and a second curve 212 that shows the received voltage signal VRX− at the output 141 of the isolation circuit. The graph 210 illustrates example operation with little or no common mode voltage VCM. In this operating condition, the diodes 145 (e.g., DO+) and 148 (e.g., GD−) are clamped between times T1 and T2, and the peak portions of the associated sinusoidal waveform are clamped at the associated diode voltages. In the second illustrated half-cycle of the transmitted voltage signal VDM, the diodes 146 (e.g., DG+) and 147 (e.g., DO−) are clamped between times T3 and T4. Using only voltage sensing of the voltage across the isolation circuit outputs 140 and 141, the presence or absence of the transmitted voltage signal VDM can be detected where little or no common mode voltage VCM is present.

The graph 220 in FIG. 2 shows a curve 221 that represents the received voltage signal VRX+ at the output 140, and a curve 222 that represents the received voltage signal VRX− at the output 141 of the isolation circuit in the presence of a significant common mode voltage VCM (e.g., common mode voltage levels associated with electrostatic discharge (ESD) immunity compliance testing per IEC61000 and/or ground knowledge transient immunity (GNTI) testing, such as up to 64 V peak to peak common mode noise). In this operating condition, the diodes 145 (e.g., DO+) and 147 (e.g., DO−) are clamped between times T5 and T6, and the peak portions of the associated sinusoidal waveform are clamped at the associated diode voltages. In the second illustrated half-cycle of the transmitted voltage signal VDM, the diodes 146 (e.g., DG+) and 148 (e.g., DG−) are clamped between times T7 and T8.

As shown in the graph 220, detection of the transmitted signal from the signal generator 120 is difficult based only on voltage sensing, as transitions are only discernible between times T6 and T7, or between time T8 and T5 of the next transmitted signal cycle. FIG. 2 demonstrates problems associated with signal reconstruction and detection in an isolated system having the first circuit 128 and the second circuit 129 on different sides of the isolation barrier 127 in FIGS. 1 and 1A where power is transmitted through the isolation barrier 127.

The signal detector circuit 150 of FIG. 1A mitigates or overcomes these difficulties and facilitates signal reconstruction and/or detection of the presence or absence of the transmitted signal from the signal generators 120 in the presence of common mode noise or interference.

FIG. 3 shows another example implementation of a rectifier and detector circuit 300. The rectifier and detector circuit 300 includes a rectifier circuit formed by a full bridge configuration of transistors 345, 346, 347 and 348 which implement the functions described above in connection with the rectifier circuit 144 in FIG. 1A. In addition, the rectifier and detector circuit 300 includes a differential signal detector circuit that implements the functions described above in connection with the signal detector circuit 150 of FIG. 1A. Similar or equivalent circuits or components are similarly numbered in FIGS. 1A and 3. In the implementation of FIG. 3, the equivalent rectifier diodes 145-148 (e.g., FIG. 1A above) are shown in dashed line to illustrate the rectifier operation and interconnection of the respective transistors 345-348. The transistors 345 and 347 have gates biased by a first voltage source 301 that provides a bias voltage VBP to the transistor gates relative to the rectified voltage output signal VO at the rectifier output 136. The transistors 346 and 348 have gates biased by a second voltage source 302 that provides a bias voltage VBN to the transistor gates relative to the common or reference voltage signal COM at the rectifier output 138. With the bias voltage is VBP and VBN approximately equal to the threshold voltages of the respective transistors 345-348, the rectifier circuit in FIG. 3 provides full bridge rectification of the differential signal VRX+, VRX− received at the outputs 140 and 141 of the isolation circuit for an individual channel.

In another implementation, the rectifier circuit can be implemented using diodes, such as the diodes 145-148 shown in dashed line in FIG. 3. As discussed above in connection with FIG. 1A, other implementations of the rectifier and detector circuit 300 can have differential circuit structures as shown in FIG. 3 or can be single ended circuits, such as by omitting one of the two illustrated branch circuits.

The signal detector circuit in FIG. 3 provides voltage sensing as well as current sensing and integration to reconstruct and detect the presence of a transmitted signal from the signal generator 120 even in the presence of common mode noise or interference in the rectifier and detector circuit 300. The signal detector circuit is a differential circuit with a first branch that includes a summing circuit 151, upper and lower integrator circuits 152 and 153, and a resistor divider voltage sensing circuit 154. An output of the summing circuit 151 is coupled to a first input of a differential filter 156. A differential output of the filter 156 is coupled to a differential amplifier 158. The output of the differential amplifier 158 is coupled to an input of a comparator 159. The output of the comparator 159 provides the signal detector signal DET at the output 134. The signal detector circuit in FIG. 3 also includes a second branch that includes a summing circuit 161, upper and lower integrator circuits 162 and 163, and a resistor divider voltage sensing circuit 164. An output of the summing circuit 161 is coupled to a second input of the filter 156. In operation, comparator 159 compares the voltage signal at the output of the differential amplifier 158 to a threshold voltage VTH to generate the signal detector signal DET at the output 134 of the rectifier and detector circuit 130 responsive to detection of a signal at the output 140, 141 of the isolation circuit. In another example, the signal detector circuit 150 is a single ended circuit having two integrator circuits, a voltage sensing circuit and a single summing circuit, and one of the circuit branches in FIG. 3 is omitted.

The summing circuit 151 includes a first capacitor 311, a second capacitor 312, and a third capacitor 313. In one example, the capacitors 311-313 have the same capacitance CC. In another example, one of the capacitors 311-313 has a different capacitance than one or both of the other capacitors of the summing circuit 151. The first capacitor 311 is coupled between an output of the upper integrator circuit 152 and a first summing node 310 that forms an output of the summing circuit 151. The first capacitor 311 AC couples a voltage signal VI1P from the output of the upper integrator circuit 152 to the first summing node 310. The second capacitor 312 is coupled between an output of the lower integrator circuit 153 and the first summing node 310. The second capacitor 312 AC couples a voltage signal VI2P from the output of the lower integrator circuit 153 to the first summing node 310. The third capacitor 313 is coupled between an output of the resistor divider voltage sensing circuit 154 and the first summing node 310. The third capacitor 313 AC couples a voltage sense signal VVP from the output of the resistor divider voltage sensing circuit 154 to the first summing node 310. The first summing node 310 sums the sensor voltage signal VVP and the integrator voltage signals VI1P and VI2P and generates a summed voltage signal VSP as the sum of the voltages VI1P, VI2P, and VVP to a first input of the filter 156.

The upper integrator circuit 152 includes an integrator input, and integrator output, a sense resistor 314 having a resistance RS, and a sense capacitor 315 having a capacitance CS. The sense resistor 314 and the sense capacitor 315 are coupled in parallel with one another between the source of the transistor 345 (e.g., the cathode of the diode 145) and the rectifier output 136. The source of the transistor 345 forms the output of the upper integrated circuit 152 and is coupled to the first capacitor 311 of the summing circuit 151. During operation of the rectifier circuit, the upper integrator circuit 152 integrates a current I1 that flows along a path 331 through the transistor 345 (e.g., or through the diode 145). The integrator circuit 152 develops a voltage V1 across the sense capacitor 315 and generates an integrator voltage signal VI1P at the integrator circuit output, which is coupled to the upper terminal of the capacitor 311 of the summing circuit 151.

The lower integrator circuit 153 includes an integrator input, and integrator output, a sense resistor 316 having a resistance RS, and a sense capacitor 317 having a capacitance CS. The sense resistor 316 and the sense capacitor 317 are coupled in parallel with one another between the source of the transistor 346 (e.g., the anode of the diode 146) and the rectifier output 138. The source of the transistor 346 forms the output of the lower integrated circuit 153 and is coupled to the second capacitor 312 of the summing circuit 151. In operation of the rectifier circuit, the lower integrator circuit 153 integrates a current I2 that flows along a path 332 through the transistor 346 (e.g., or through the diode 146). The integrator circuit 153 develops a voltage V2 across the sense capacitor 317 and generates an integrator voltage signal VI2P at the integrator circuit output, which is coupled to the lower terminal of the capacitor 312 of the summing circuit 151.

The resistor divider voltage sensing circuit 154 includes a first resistor 318 coupled in series with a second resistor 319 between the output 140 of the isolator circuit and the rectifier output 138. The first resistor 318 has a first resistance R1, and the second resistor 319 has a resistance R2. A first terminal of the first resistor 318 forms a voltage sense input and is coupled to the output 140 of the isolation circuit to receive the voltage VRX+ of the rectifier circuit. The node that joins the resistors 318 and 319 forms a voltage sense output of the resistor divider voltage sensing circuit 154 and is coupled to the third capacitor 313 of the summing circuit 151. In operation, the voltage sensing circuit 154 provides a second signal VVP at the voltage sense output that represents the voltage VRX+ of the rectifier circuit 144.

In the second branch of FIG. 3, the summing circuit 161 includes a first capacitor 321, a second capacitor 322, and a third capacitor 323. In one example, the capacitors 321-323 have the same capacitance CC. In another example, one of the capacitors 321-323 has a different capacitance than one or both of the other capacitors of the summing circuit 161. The first capacitor 321 is coupled between an output of the upper integrator circuit 162 and a second summing node 320 that forms an output of the summing circuit 161. The first capacitor 321 AC couples a voltage signal VI1N from the output of the upper integrator circuit 162 to the second summing node 320. The second capacitor 322 is coupled between an output of the lower integrator circuit 163 and the second summing node 320. The second capacitor 322 AC couples a voltage signal VI2N from the output of the lower integrator circuit 163 to the second summing node 320. The third capacitor 323 is coupled between an output of the resistor divider voltage sensing circuit 164 and the second summing node 320. The third capacitor 323 AC couples a voltage sense signal VVN from the output of the resistor divider voltage sensing circuit 164 to the second summing node 320. The second summing node 320 sums the sensor voltage signal VVN and the integrator voltage signals VI1N and VI2N and generates summed voltage signal VSP as the sum of the voltages VI1N, VI2N, and VVN to a second input of the filter 156.

In the second branch of FIG. 3, the upper integrator circuit 162 includes an integrator input, and integrator output, a sense resistor 324 having a resistance RS, and a sense capacitor 325 having a capacitance CS. The sense resistor 324 and the sense capacitor 325 are coupled in parallel with one another between the source of the transistor 347 (e.g., the cathode of the diode 147) and the rectifier output 136. The source of the transistor 347 forms the output of the upper integrated circuit 162 and is coupled to the first capacitor 321 of the summing circuit 161. During operation of the rectifier circuit, the upper integrator circuit 162 integrates a current I3 that flows along a path 341 through the transistor 347 (e.g., or through the diode 147). The integrator circuit 162 develops a voltage V3 across the sense capacitor 325 and generates an integrator voltage signal VI1N at the integrator circuit output, which is coupled to the upper terminal of the capacitor 321 of the summing circuit 161.

The lower integrator circuit 163 includes an integrator input, and integrator output, a sense resistor 326 having a resistance RS, and a sense capacitor 327 having a capacitance CS. The sense resistor 326 and the sense capacitor 327 are coupled in parallel with one another between the source of the transistor 348 (e.g., the anode of the diode 148) and the rectifier output 138. The source of the transistor 348 forms the output of the lower integrated circuit 163 and is coupled to the second capacitor 322 of the summing circuit 161. In operation of the rectifier circuit, the lower integrator circuit 163 integrates a current I4 that flows along a path 342 through the transistor 348 (e.g., or through the diode 148). The integrator circuit 163 develops a voltage V4 across the sense capacitor 327 and generates an integrator voltage signal VI2N at the integrator circuit output, which is coupled to the lower terminal of the capacitor 322 of the summing circuit 161.

The resistor divider voltage sensing circuit 164 includes a first resistor 328 coupled in series with a second resistor 329 between the output 141 of the isolator circuit and the rectifier output 138. The first resistor 328 has a first resistance R1, and the second resistor 329 has a resistance R2. A first terminal of the first resistor 328 forms a voltage sense input and is coupled to the output 141 of the isolation circuit to receive the voltage VRX− of the rectifier circuit. The node that joins the resistors 328 and 329 forms a voltage sense output of the resistor divider voltage sensing circuit 164 and is coupled to the third capacitor 323 of the summing circuit 161. In operation, the voltage sensing circuit 164 provides a second signal VVN at the voltage sense output that represents the voltage VRX− of the rectifier circuit 144.

The outputs of the summing circuits 151 and 161 (e.g., the respective first and second summing nodes 310 and 320) are coupled to respective inputs of the filter 156. The filter 156 in one example is an RC circuit with resistors and capacitors that form a differential low pass filter. In one example, the low-pass filter is a first-order low-pass filter. In another example, the low-pass filter is a second or higher order low-pass filter. In another implementation, the filter 156 is a bandpass or a band stop filter of any suitable order. In a further implementation, the filter 156 includes resistors and capacitors as well as amplifiers or other circuitry to provide low pass or other desirable form of filtering.

A differential output of the filter 156 in FIG. 3 is coupled to first and second inputs of the differential amplifier 158. The output of the differential amplifier 158 is coupled to an input of the comparator 159. The differential amplifier 158 provides a voltage output signal VDIF to the input of the comparator 159 based on the differential filtered signal from the filter 156. A second input of the comparator 159 is coupled to a bandgap reference or other reference circuit (not shown) to receive the threshold voltage VTH. In operation, the comparator 159 compares the sum voltage signal VSP, VSN, as amplified and filtered by the differential amplifier 158 and the filter 156, to the threshold voltage of VTH, and provides the signal detector signal DET at the output 134 according to the comparison of the signals. In the illustrated example, the comparator 159 compares the amplified signal VDIF to the threshold voltage to generate the comparator output signal DET which is provided to the output 134 of the signal detector circuit. In another example, the filter 156 is omitted. In this or another example, the differential amplifier is omitted. Moreover, as discussed above, other implementations involve single ended circuitry, for example, with half bridge rectification, and the filtering and amplification is implemented by single ended circuitry. In this or another implementation, the filter 156 and/or the amplifier 158 are omitted, and the comparator 159 compares the threshold voltage of VTH to a summed voltage signal based on summation of one or more current integration circuit outputs and a voltage sense output.

The actuator circuit 133 is selectively enabled or disabled according to the comparator output signal DET. In one implementation, the actuator circuit 133 is or includes a gate driver coupled to an associated transistor or transistors (e.g., as shown in FIG. 1 above), and the comparator output signal DET controls the driver actuator 133 to selectively turn the transistor on or off. In the illustrated implementation of FIGS. 1, for example, the processor 104 controls the enable signals EN1, EN2, and EN3 to selectively cause the signal generators 120 to generate a respective AC signal that is provided to the associated inputs 124, 126 of the isolation circuit. The rectifier circuit (e.g., transistors 345-348 in FIG. 3) rectifies the voltage VRX+, VRX− at the outputs 140, 141 of the isolation circuit to provide power to operate the driver actuator circuits 133. The driver actuator circuits 133 integrate one or more rectifier current signals and sense one or more rectifier voltage signals, which are summed by the summing circuit or circuits 151, 161, and the comparator 159 provides the comparator output signal DET in a first state (e.g., high) to selectively turn the associated transistor on if the summed voltage (e.g., directly or after filtering and amplification) exceeds the threshold voltage VTH indicating that the signal generator 120 of a given channel has generated a signal at the isolation circuit input. Otherwise, if the comparator 159 determines that the threshold voltage has not been exceeded by the summed voltage, the comparator 159 generates the comparator output signal DET in a different second state (e.g., low) to turn the associated transistor off. In this manner, the signal detector circuitry determines the presence or absence of a signal transmitted by the signal generator 120, independent of whether the second circuit 129 is subjected to common mode noise or interference.

Figure 3A:
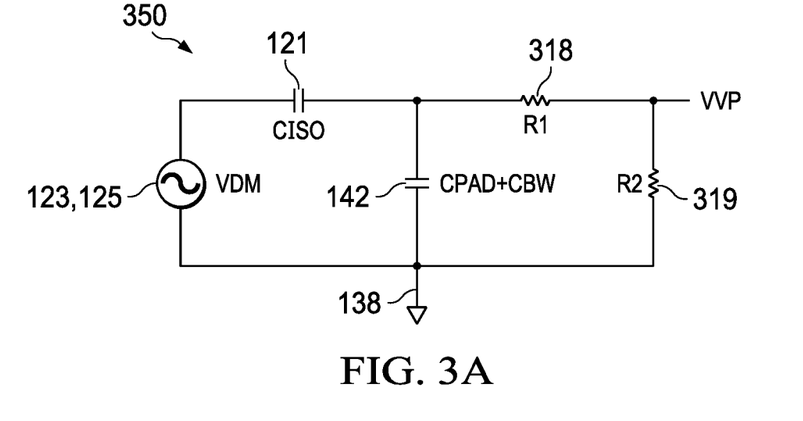
FIG. 3A is a simplified schematic diagram of an equivalent voltage sensing path circuit in the rectifier and detector circuit of FIG. 3.
Figure 3B:
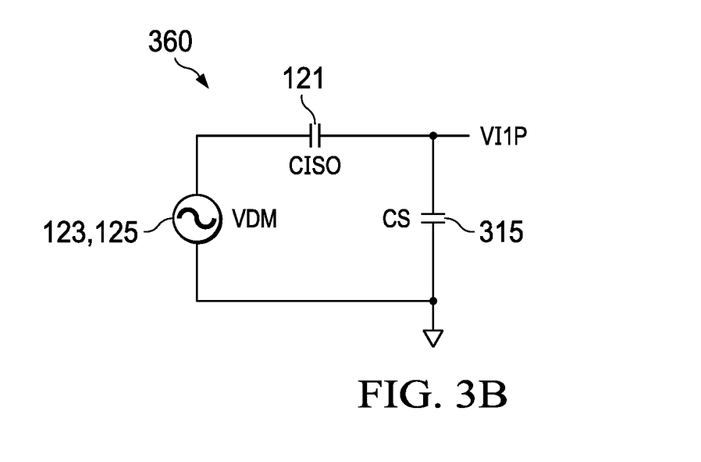
FIG. 3B is a simplified schematic diagram of an equivalent current sensing path circuit in the rectifier and detector circuit of FIG. 3.

Referring also to FIGS. 3A, 3B, 4, and 4A, FIG. 3A shows an equivalent voltage sensing path circuit 350 in the rectifier and detector circuit 300 of FIG. 3. FIG. 3A can be considered as the equivalent differential half circuit when neither DO or DG are conducting. The voltage sensing path circuit 350 includes the AC signal generators 123, 125 of the signal generator 120, the isolation circuit capacitor 121 and the capacitor 142 that represents parasitic capacitances CPAD+CBW between the respective outputs 140 and 141 of the isolation circuit and the rectifier output 138, as discussed above in connection with FIG. 1A. In addition, the equivalent voltage sensing path circuit 350 includes the voltage divider provided by the first resistor 318 and the second resistor 319 of the voltage sensing circuit 154 (e.g., FIG. 3). The equivalent circuit 350 facilitates sensing of the rectifier circuit voltage to produce the voltage sense signal VVP=VDM (CISO/(CISO+CPAD+CBW))*R2/(R1+R2). FIG. 3B shows an equivalent current sensing path circuit 360 in the rectifier and detector circuit 300 of FIG. 3. FIG. 3B can be considered as the equivalent differential half circuit when either DO or DG are conducting. The equivalent circuit 360 includes the AC signal generators 123, 125 of the signal generator 120 as well as a capacitive divider circuit formed by the isolation capacitor 121 and the sense capacitor 315 of the upper integrator circuit 152. The equivalent circuit 360 facilitates sensing of the integral of the current I1 of the rectifier circuit to produce the integrator output voltage signal VI1P=VDM*CISO/(CISO+CS). In this example, the voltage and current integral sensing circuits shown by the respective equivalent circuits 350 and 360 have the same gain CISO/(CISO+CS)=CISO/(CISO+CPAD+CBW)*R2/(R1+R2), although not a requirement of all possible implementations.

Figure 4:
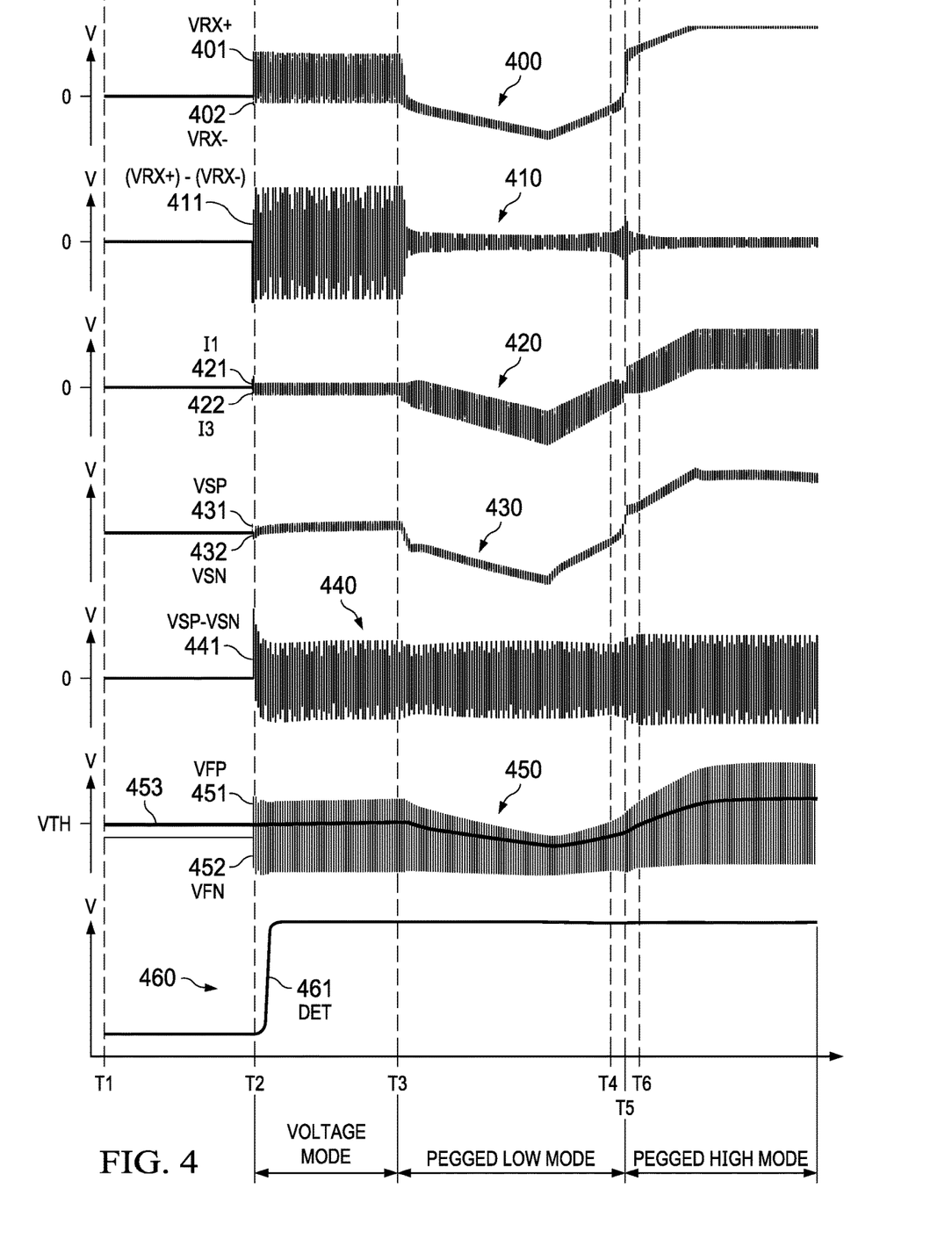
FIG. 4 is a signal diagram of signals in the rectifier and detector circuit of FIG. 3.
Figure 4A:
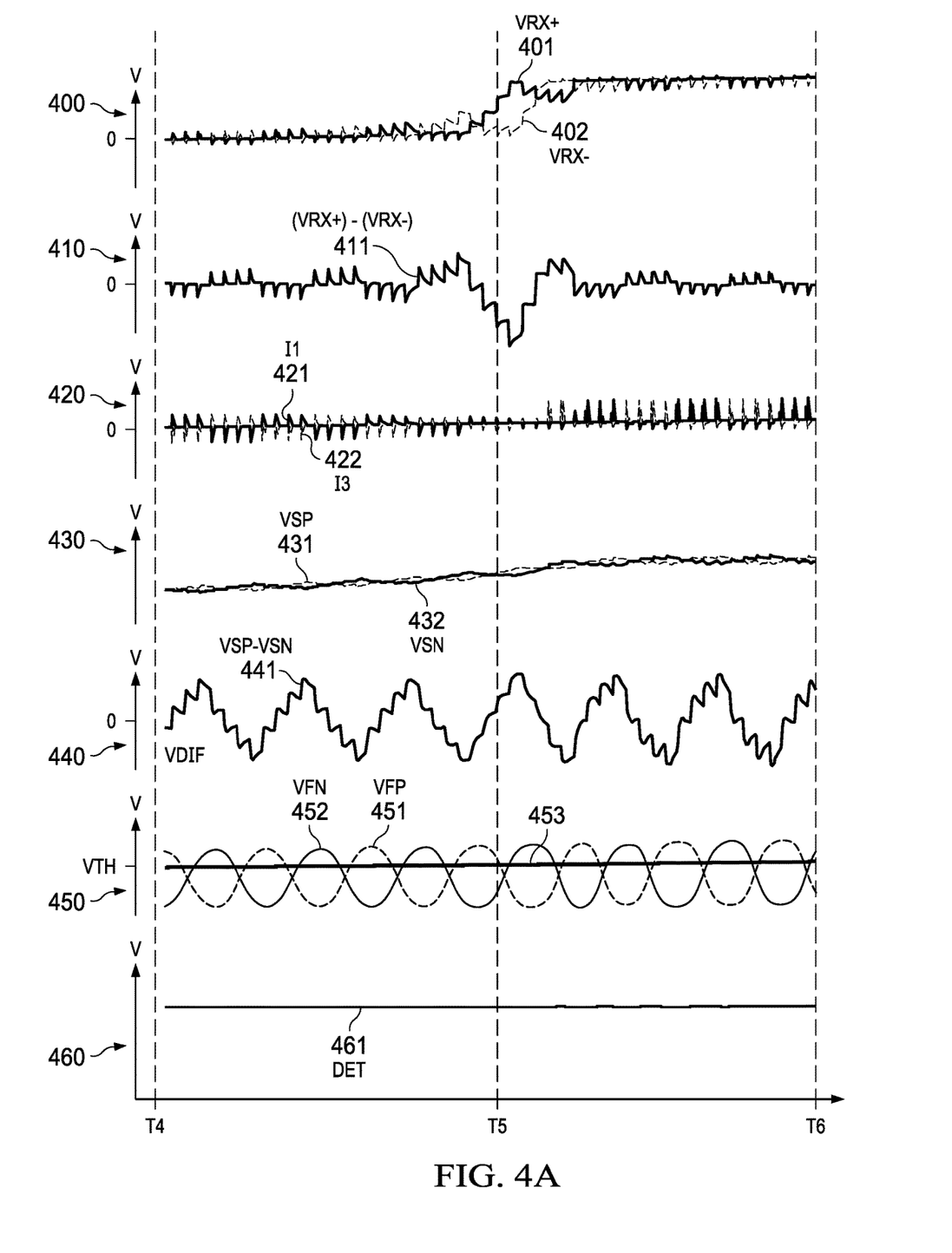
FIG. 4A is a partial signal diagram of signals in a portion of the signal diagram of FIG. 4.

FIG. 4 shows graphs 400, 410, 420, 430, 440, 450, and 460 that illustrate signals in the rectifier and detector circuit of FIG. 3 as a function of time during operation of the system 100 of FIG. 1, and FIG. 4A shows the signals in a portion time range of the signal diagram of FIG. 4. A first curve 401 in the graph 400 illustrates the first voltage signal VRX+ at the isolation circuit output 140, and a second curve 402 shows the second voltage signal VRX− at the output 141. The graph 410 shows a curve 411 that illustrates the difference between the first and second voltage signals (e.g., VRX+−VRX−). A first curve 421 in the graph 420 illustrates the rectifier circuit current I1 flowing in the transistor 345 (e.g., or the diode 145) in FIG. 3, and a second curve 422 shows a corresponding rectifier circuit current I3 flowing in the transistor 347 (e.g., or the diode 147). A curve 431 in the graph 430 illustrates the summed voltage signal VSP (e.g., the sum of the voltages VI1P, VI2P, and VVP) provided to the first input of the filter 156 in FIG. 3, and a second curve 432 shows the summed voltage signal VSN provided to the second input of the filter 156. The graph 440 shows a curve 441 the represents the difference between the summed voltage signals (e.g., VSP−VSN). The graph 450 illustrates the voltages at the respective outputs of the differential filter 156. A first curve 451 in the graph 450 shows the first differential output voltage of the filter 156 (e.g., labeled VFP in FIG. 4), and a second curve 452 shows the second differential output voltage (e.g., labeled VFN). A curve 461 in the graph 460 illustrates the signal detector signal DET at the signal detector output 134.

The example operation begins at time T1 in FIG. 4, and the signal generator 120 (FIGS. 1 and 1A) generates an AC output signal at the isolation circuit inputs 124 and 126 responsive to the processor 104 asserting the corresponding enable signal at time T2. From time T2 until time T3 in FIG. 4, the rectifier and signal detector circuit 300 operates to rectify power from the outputs 140, 141 of the isolation circuit and to detect the presence of a valid signal received from the signal generator 120. During this time (labeled VOLTAGE MODE in FIG. 4), the rectifier voltage inputs (e.g., VRX+−VRX-shown by curve 411) has a sufficient amplitude to allow rectification, and the rectifier current signals (e.g., curves 421 and 422) are of relatively low amplitude.

At time T3 and FIG. 4, the circuit 300 is subjected to a significant amount of common mode noise or interference (e.g., VCM from the modeled common mode voltage source 139 in FIG. 1A above). From time T3 until time T5, the curve 411 shows a significant decrease in the rectifier circuit voltage, but the amplitude of the current curve 421 and 422 increases. During this time (e.g., labeled PEGGED LOW MODE corresponding to the "DG+, DG− CLAMPED" condition from T7 through T8 in FIG. 2), the curves 441, 451 and 452 are of substantially similar amplitude compared to the VOLTAGE MODE from time T1 through time T3. Accordingly, the signal detector circuit continues to correctly detect the presence of a valid signal transmitted by the signal generator 120. In this example, the graph 450 also includes an example threshold voltage curve 453, and the filtered voltage curves 451 and 452 have amplitudes that exceed the threshold value VTH, leading to the comparator 159 continuing to correctly assert the signal detector signal DET in a high state from T3 through T5.

At T5 in this example, the circuit transitions into a different mode where the rectifier device voltages are clamped high (e.g., labeled PEGGED HIGH MODE in FIG. 4, corresponding to the "DO+, DO− CLAMPED" condition from T5 through T6 in FIG. 2). The signal detector circuit of FIG. 3 in this example continues to correctly detect the presence of a valid signal transmitted by the signal generator 120. In this example, the graph 450 also includes an example threshold voltage curve 453, and the filtered voltage curves 451 and 452 have amplitudes that exceed the threshold value VTH, leading to the comparator 159 continuing to correctly assert the signal detector signal DET in a high state from T3 through T5.

FIG. 4A illustrates portions of the graphs 400, 410, 420, 430, 440, 450, and 460 from time T4 through time T6, including the time T5 at which the common mode voltage (e.g., noise or interference) is introduced into the circuit 300. As shown in FIGS. 4 and 4A, the circuit 300 correctly asserts the signal detector signal DET responsive to the actual presence of a transmitted signal from the signal generator 120 independent of the presence or absence of common mode noise or interference. In addition, the circuit 300 and the electronic device 101 transfer power across the isolation barrier 127 from the first circuit 128 to the second circuit 129. This operation allows the processor 104 (e.g., FIG. 1) to control operation of the transistors 132 based on the enable signals EN1, EN2, and EN3. The signal detector circuitry in these examples successfully and correctly detect the presence or absence of a signal from the signal generator 120 even in the presence of large common mode signals that can swamp the rectifiers of the rectifier circuitry. In this manner, the signal is correctly detected even in situations where peer voltage sensing in the second circuit 129 cannot differentiate between common mode noise or interference and actual signals provided by the signal generator 120. The illustrated examples provide common-mode insensitive reconstruction of the signal from the signal generators 120 incorporation a voltage sensing and current integration sensing in combination with the rectifier circuitry, allowing seamless and reliable detection that the signal generator 120 is operating, even where the voltage component of the signal generated by the signal generator 120 is much smaller than the common mode noise or interference.

Figure 5:
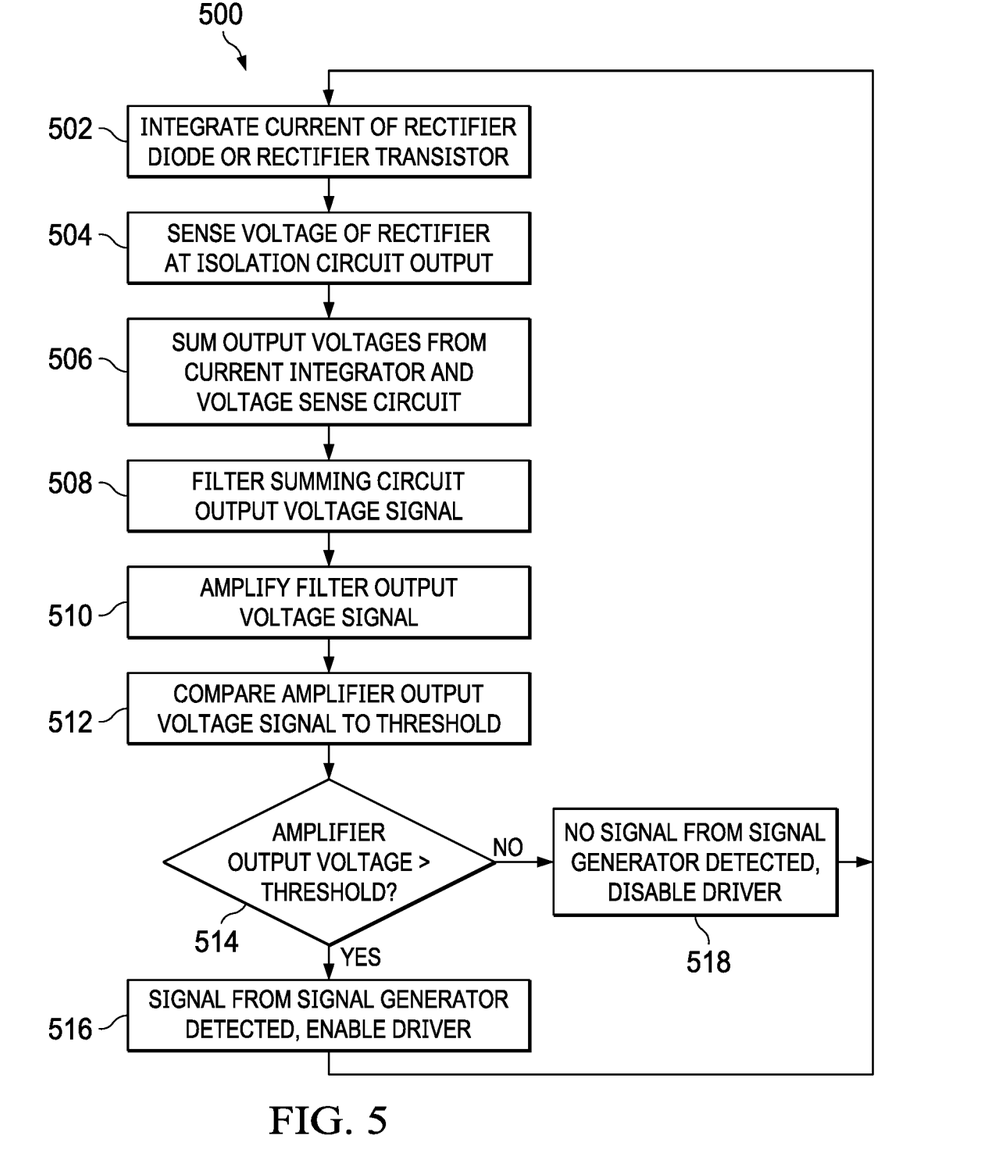
FIG. 5 is a flow diagram of a method.

FIG. 5 shows a method 500 according to another aspect. The method 500 begins at 502 with integrating a current of a rectifier diode or rectifier transistor. In one example, the integrator circuits 152, 153, 162, and 163 in FIGS. 1A and 3 integrate the respective currents (e.g., I1, I2, I3 and I4 in FIG. 3) of the respective rectifier transistors 345, 346, 347, and 348 (or of the respective diodes 145-148). The integration at 502 generates an integrator voltage signal (e.g., V1-V4 and VI1P, VI2P, VI1N, and VI2N in FIG. 3). The method 500 continues at 504 with sensing a voltage of the rectifier circuit at an isolation circuit output. In the example of FIGS. 1A and 3, the signal detector circuits include the voltage sensing circuits 154 and 164 that sense the voltages VRX+, VRX− of the rectifier circuit 144 to generate the respective sensor voltage signals VVP and VVN. The method 500 also includes summing the sensor voltage signals and the integrator voltage signals to generate a summed voltage signal. In the illustrated example, the summing circuits 151 and 161 some the sensor voltage signals VVP, VVN and the respective integrator voltage signals (VI1P, VI2P, VI1N, and VI2N in FIG. 3) to generate the respective summed voltage signals VSP and VSN. At 508, the method also includes filtering the summing circuit output voltage signal. In the above example, the differential filter 156 filters the differential summed voltage signal VSP, VSN to generate a filtered signal (e.g., graphs 450 and 460 in FIGS. 4 and 4A). At 510 in FIG. 5, the method includes amplifying the filter output voltage signal. The differential amplifier 158 in the above examples amplifies the filtered differential signal from the filter 156. At 512, the method includes comparing the amplifier output voltage signal to a threshold, and determining at 514 whether the amplifier output voltage exceeds the threshold. In the above example, the comparator 159 compares the amplifier output voltage VDIF to the threshold voltage V TH (e.g., FIG. 3). If the amplifier output voltage exceeds threshold (YES at 514), the method 500 includes determining that the signal from the signal generator 120 is detected, and enabling the driver at 516. Otherwise (NO at 514), the method includes determining at 518 that no signal from the signal generator has been detected, and disabling the driver. In this manner, the method 500 includes selectively enabling (e.g., at 516) or disabling (e.g., at 518) the actuator circuit 133 based on the comparator output signal DET. In the illustrated example, the comparator 159 provides an active high comparator output signal DET that enables the actuator circuit 133 responsive to the amplified signal exceeding the threshold voltage VTH based on the comparator output signal DET (516 in FIG. 5). In addition, the comparator 159 provides a low comparator output signal DET (518 in FIG. 5) that disables actuator circuit 133 responsive to the amplified signal not exceeding the threshold voltage VTH based on the comparator output signal DET.

Modifications are possible in the described examples, and other implementations are possible, within the scope of the claims.

What is claimed is:

1. An electronic device, comprising:
a first rectifying device having a first positive terminal and a first negative terminal, the first positive terminal coupled to a rectifier input, and the first negative terminal coupled to a rectifier output;
a second rectifying device having a second positive terminal and a second negative terminal, the second positive terminal coupled to a ground terminal, and the second negative terminal coupled to the rectifier input; and
a signal detector circuit having a detector output and including:
a current sense circuit having a first current sense terminal and a second current sense terminal, the first current sense terminal coupled to one of the first negative terminal or the second positive terminal, the second current sense terminal coupled to one of the rectifier output or the ground terminal; and
a summation circuit having a first summation input, a second summation input, and a summation output, the first summation input coupled to the rectifier input, the second summation input coupled to the first current sense terminal, and the summation output coupled to the detector output.

2. The electronic device of claim 1, wherein:
the current sense circuit is a first current sense circuit, the first current sense terminal coupled to the first negative terminal, and the second current sense terminal coupled to the rectifier output;
the electronic device further comprises a second current sense circuit having a third current sense terminal and a fourth current sense terminal, the third current sense terminal coupled to the second positive terminal, and the fourth current sense terminal coupled to the ground terminal; and
the summation circuit has a third summation input coupled to the third current sense terminal.

3. The electronic device of claim 2, wherein the rectifier input is a first rectifier input, the summation circuit is a first summation circuit, the summation output is a first summation output, and the electronic device further comprises:
a third rectifying device having a third positive terminal and a third negative terminal, the third positive terminal coupled to a second rectifier input, and the third negative terminal coupled to the rectifier output; and
a fourth rectifying device having a fourth positive terminal and a fourth negative terminal, the fourth positive terminal coupled to the ground terminal, and the fourth negative terminal coupled to the second rectifier input; and
the signal detector circuit further includes:
a third current sense circuit having a fifth current sense terminal and a sixth current sense terminal, the fifth current sense terminal coupled to one of the third negative terminal or the fourth positive terminal, and the sixth current sense terminal coupled to one of the rectifier output or the ground terminal; and
a second summation circuit having a fourth summation input, a fifth summation input, a sixth summation input, and a second summation output, the fourth summation input coupled to the second rectifier input, the fifth summation input coupled to the fifth current sense terminal, the sixth summation input coupled to the second rectifier input, and the second summation output coupled to the detector output.

4. The electronic device of claim 3, wherein the fifth current sense terminal is coupled to the third negative terminal and the sixth current sense terminal is coupled to the rectifier output; and
wherein the signal detector circuit further includes a fourth current sense circuit having a seventh current sense terminal and an eighth current sense terminal, the seventh current sense terminal coupled to the fourth positive terminal and the eighth current sense terminal coupled to the ground terminal.

5. The electronic device of claim 1, wherein the first rectifying device includes a first transistor or a first diode, and the second rectifying device includes a second transistor or a second diode.

6. The electronic device of claim 1, wherein:
the current sense circuit includes a resistor coupled between the first and second current sense terminals.

7. The electronic device of claim 6, further comprising a capacitor coupled between the first and second current sense terminals.

8. The electronic device of claim 1, wherein:
the summation circuit includes a first capacitors coupled between the first summation input and the summation output, and a second capacitor coupled between the second summation input and the summation output.

9. The electronic device of claim 1, wherein the summation circuit has a third summation input, and the electronic device further comprises a resistive divider having a divider input and a divider output, the divider input coupled to the rectifier input, and the divider output coupled to the third summation input.

10. The electronic device of claim 4, further comprising:
a differential amplifier having first and second amplifier inputs and an amplifier output, the first amplifier input coupled to the first summation output, the second amplifier input coupled to the second summation output, and the amplifier output coupled to the detector output; and
a driver circuit having a power terminal, a driver input, and a driver output, the power terminal coupled to the rectifier output, the driver input coupled to the detector output, the driver circuit configured to provide a signal at the driver output responsive to a state of the driver input.

11. The electronic device of claim 10, further comprising a filter coupled between the first summation output and the first amplifier input and between the second summation output and the second amplifier input.

12. The electronic device of claim 3, wherein the first and second rectifier inputs are different inputs.

13. The electronic device of claim 3, further comprising:
a differential circuit having inputs and differential outputs; and
a first capacitor coupled between a first one of the differential output and the first rectifier input; and
a second capacitor coupled between a second one of the differential outputs and the second rectifier input.

14. An electronic device, comprising:
- an amplifier having an amplifier input and an amplifier output;
- a rectifier circuit having a rectifier input, a ground terminal, and a rectifier output;
- a capacitor coupled between the amplifier output and the rectifier input;
- a signal detector circuit having first and second current sense terminals, a voltage sense terminal, and a detector output, the first current sense terminal coupled to the rectifier output, the second current sense terminal coupled to the ground terminal, and the voltage sense terminal coupled to the rectifier input; and
- an actuator circuit having a power terminal and an actuator input, the power terminal coupled to the rectifier output, and the actuator input coupled to the detector output.

15. The electronic device of claim 14, wherein the rectifier circuit includes:
- a first rectifying device having a first positive terminal and a first negative terminal, the first positive terminal coupled to the rectifier input, and the first negative terminal coupled to the rectifier output; and
- a second rectifying device having a second positive terminal and a second negative terminal, the second positive terminal coupled to the ground terminal, and the second negative terminal coupled to the rectifier input; and
- wherein the signal detector circuit includes:
  - a first current sense circuit having the first current sense terminal and a third current sense terminal, the first current sense terminal coupled to the first negative terminal, and the third current sense terminal coupled to the rectifier output;
  - a second current sense circuit having the second current sense terminal and a fourth current sense terminal, the second current sense terminal coupled to the second positive terminal, and the fourth current sense terminal coupled to the ground terminal; and
  - a summation circuit having a first summation input, a second summation input, a third summation input, and a summation output, the first summation input coupled to the first current sense terminal, the second summation input coupled to the second current sense terminal, the third summation input coupled to the voltage sense terminal, and the summation output coupled to the detector output.

16. The electronic device of claim 15, wherein the amplifier is a differential circuit having inputs and differential outputs, the rectifier input is a first rectifier input, the capacitor is a first capacitor coupled between a first one of the differential outputs and the first rectifier input, the summation circuit is a first summation circuit, the summation output is a first summation output, the rectifier circuit has a second rectifier input and includes:
- a third rectifying device having a third positive terminal and a third negative terminal, the third positive terminal coupled to the second rectifier input, and the third negative terminal coupled to the rectifier output; and
- a fourth rectifying device having a fourth positive terminal and a fourth negative terminal, the fourth positive terminal coupled to the ground terminal, and the fourth negative terminal coupled to the second rectifier input;
- wherein the electronic device further comprises a second capacitor coupled between a second one of the differential outputs and the second rectifier input; and
- wherein the signal detector circuit includes:
  - a third current sense circuit having a fifth current sense terminal and a sixth current sense terminal, the fifth current sense terminal coupled to the third negative terminal, and the sixth current sense terminal coupled to the rectifier output;
  - a fourth current sense circuit having a seventh current sense terminal and an eighth current sense terminal, the seventh current sense terminal coupled to the fourth positive terminal, and the eighth current sense terminal coupled to the ground terminal; and
  - a second summation circuit having a fourth summation input, a fifth summation input, a sixth summation input, and a second summation output, the fourth summation input coupled to the fifth current sense terminal, the fifth summation input coupled to the seventh current sense terminal, the sixth summation input coupled to the second rectifier input, and the second summation output coupled to the detector output.

17. The electronic device of claim 15, wherein the first rectifying device includes a first transistor or a first diode, and the second rectifying device includes a second transistor or a second diode.

18. The electronic device of claim 15, wherein:
the first current sense circuit includes a first resistor coupled between the first and third current sense terminals, and the second current sense circuit includes a second resistor coupled between the second and fourth current sense terminals.

19. The electronic device of claim 18, wherein the capacitor is a first capacitor, and the signal detector circuit further includes: a second capacitor coupled between the first and third current sense terminals, and a third capacitor coupled between the second and fourth current sense terminals.

20. The electronic device of claim 15, wherein the capacitor is a first capacitor, and the summation circuit includes:
- a second capacitor coupled between the first summation input and the summation output;
- a third capacitor coupled between the second summation input and the summation output; and
- a fourth capacitor coupled between the third summation input and the summation output.

21. The electronic device of claim 14, further comprising a resistive divider having a divider input and a divider output, the divider input coupled to the rectifier input, and the divider output coupled to the voltage sense terminal.

* * * * *